(12) United States Patent
Engel et al.

(10) Patent No.: US 11,353,520 B2
(45) Date of Patent: Jun. 7, 2022

(54) BIPOLAR CHOPPING FOR 1/F NOISE AND OFFSET REDUCTION IN MAGNETIC FIELD SENSORS

(71) Applicant: EVERSPIN TECHNOLOGIES, INC., Chandler, AZ (US)

(72) Inventors: Bradley Neal Engel, Chandler, AZ (US); Phillip G. Mather, Phoenix, AZ (US)

(73) Assignee: EVERSPIN TECHNOLOGIES, INC., Chandler, AZ (US)

( * ) Notice: Subject to any disclaimer, the term of this patent is extended or adjusted under 35 U.S.C. 154(b) by 24 days.

(21) Appl. No.: 17/146,516

(22) Filed: Jan. 12, 2021

(65) Prior Publication Data

US 2021/0199729 A1 Jul. 1, 2021

Related U.S. Application Data

(63) Continuation of application No. 16/358,898, filed on Mar. 20, 2019, now Pat. No. 10,928,463, which is a
(Continued)

(51) Int. Cl.
*G01R 31/00* (2006.01)
*G01R 33/00* (2006.01)
(Continued)

(52) U.S. Cl.
CPC ......... *G01R 33/0029* (2013.01); *G01R 33/06* (2013.01); *G01R 33/09* (2013.01); *G01R 33/098* (2013.01)

(58) Field of Classification Search
USPC ........................................ 324/225, 252, 260
See application file for complete search history.

(56) References Cited

U.S. PATENT DOCUMENTS 4,138,649 A 2/1979 Schaffer
6,954,169 B1 10/2005 Min
(Continued)

FOREIGN PATENT DOCUMENTS

CN 1657967 A 8/2005
CN 100417006 C 9/2008
(Continued)

OTHER PUBLICATIONS

International Search Report and Written Opinion dated Jun. 25, 2015, in corresponding International Application No. PCT/US2015/020547.
(Continued)

*Primary Examiner* — Vincent Q Nguyen
(74) *Attorney, Agent, or Firm* — Bookoff McAndrews, PLLC

(57) ABSTRACT

A chopping technique, and associated structure, is implemented to cancel the magnetic 1/f noise contribution in a Tunneling Magnetoresistance (TMR) field sensor. The TMR field sensor includes a first bridge circuit including multiple TMR elements to sense a magnetic field and a second circuit to apply a bipolar current pulse adjacent to each TMR element. The current lines are serially or sequentially connected to a current source to receive the bipolar current pulse. The field sensor has an output including a high output and a low output in response to the bipolar pulse. This asymmetric response allows a chopping technique for 1/f noise reduction in the field sensor.

19 Claims, 5 Drawing Sheets

XY axis configuration (A)

(B)

Related U.S. Application Data continuation of application No. 15/344,149, filed on Nov. 4, 2016, now Pat. No. 10,281,531, which is a continuation of application No. 14/495,753, filed on Sep. 24, 2014, now Pat. No. 9,519,034.

(60) Provisional application No. 61/993,598, filed on May 15, 2014.

(51) Int. Cl.
  G01R 33/09 (2006.01)
  G01R 33/06 (2006.01)

(56) References Cited

U.S. PATENT DOCUMENTS

| | | |
|---|---|---|
| 7,064,937 B2 | 6/2006 | Wan et al. |
| 7,977,941 B2 | 7/2011 | Mather et al. |
| 8,242,776 B2 | 8/2012 | Mather et al. |
| 8,390,283 B2 | 3/2013 | Mather et al. |
| 9,519,034 B2 | 12/2016 | Engel et al. |
| 10,281,531 B2 | 5/2019 | Engel et al. |
| 10,928,463 B2 | 2/2021 | Engel et al. |
| 2002/0060565 A1 | 5/2002 | Tondra |
| 2003/0142527 A1 | 7/2003 | Yamada |
| 2004/0105286 A1 | 6/2004 | Jahkonen et al. |
| 2009/0102464 A1 | 4/2009 | Doogue et al. |
| 2009/0160535 A1 | 6/2009 | Rengachari |
| 2009/0237844 A1 | 9/2009 | Duric et al. |
| 2010/0052665 A1 | 3/2010 | Van Den Homberg et al. |
| 2010/0213933 A1 | 8/2010 | Mather et al. |
| 2011/0169488 A1 | 7/2011 | Mather |
| 2013/0106389 A1 | 5/2013 | Routray |
| 2013/0106410 A1 | 5/2013 | Liu et al. |
| 2014/0300348 A1* | 10/2014 | Deak ............... G01R 33/007 324/202 |
| 2015/0212166 A1 | 7/2015 | Kandori et al. |
| 2015/0331065 A1 | 11/2015 | Engel et al. |
| 2016/0041238 A1 | 2/2016 | Bai et al. |
| 2017/0074948 A1 | 3/2017 | Engel et al. |
| 2019/0212399 A1 | 7/2019 | Engel et al. |

FOREIGN PATENT DOCUMENTS

| | | |
|---|---|---|
| CN | 102292648 A | 12/2011 |
| CN | 102292773 | 12/2011 |
| CN | 102918413 | 2/2013 |
| CN | 103472409 | 12/2013 |
| CN | 103943340 A | 7/2014 |
| CN | 106662622 | 10/2019 |
| JP | 2004-515746 | 5/2004 |
| WO | WO 02/04969 | 1/2002 |
| WO | WO 2013134410 | 9/2013 |

OTHER PUBLICATIONS

International Preliminary Report on Patentability dated Nov. 15, 2016, issued in corresponding International Application No. PCT/US2015/020547 (9 pages).

Extended European Search Report issued in corresponding European Application No. EP 15 79 3363, which includes the supplementary European search report and the European search opinion, dated Dec. 1, 2017 (15 pages).

Chinese Office Action and English translation in corresponding Chinese Application No. 201580026554.1 , dated Dec. 5, 2018 (19 pages).

Chinese Office Action and English translation in Chinese Application No. 201910883968.6, dated Apr. 1, 2021 (22 pages).

* cited by examiner

XY axis configuration (A) (B)

Z axis configuration (A) (B)

BIPOLAR CHOPPING FOR 1/F NOISE AND OFFSET REDUCTION IN MAGNETIC FIELD SENSORS

CROSS-REFERENCE TO RELATED APPLICATIONS

This application is a continuation of pending U.S. application Ser. No. 16/358,898, filed Mar. 20, 2019, which is a continuation of U.S. application Ser. No. 15/344,149, filed Nov. 4, 2016, now U.S. Pat. No. 10,281,531, which is a continuation of U.S. application Ser. No. 14/495,753, filed Sep. 24, 2014, now U.S. Pat. No. 9,519,034, which claims the benefit of priority to U.S. Provisional Patent Application No. 61/993,598, filed May 15, 2014, each of which is incorporated herein by reference in its entirety.

BACKGROUND

A. Technical Field

The present invention relates generally to the field of magnetic field sensors and more particularly to method of noise and offset reduction in magnetic field sensors.

B. Background of the Invention

Magnetic field sensors have been commonly used in various electronic devices, such as computers, laptops, media players, smart phones, etc. There are several techniques/devices that can be used for detecting a magnetic field. Tunneling Magnetoresistance (TMR) is a promising magnetic sensing technology for handset applications due to its advantages in sensitivity, power, and process cost compared with other magnetic sensors. Another closely related technology in magnetic field sensing is Giant Magnetoresistance (GMR).

A TMR element is composed of two ferromagnetic layers separated by a non-magnetic, insulating tunnel barrier. One layer has a magnetization direction that is "free" to rotate in a magnetic field. The other layer has a "fixed," reference magnetization that does not rotate when in a magnetic field of moderate to low strength that is of sensing interest. If the magnetization directions of the two layers are parallel to each other, the electrical resistance of the tunnel barrier is low. Conversely, when the magnetization directions are anti-parallel, the resistance is high. A magnetic field sensor based on TMR therefore converts magnetic field into electrical signal by a change in electrical resistance due to the changing angle of the magnetic free layer relative to the fixed layer in response to the field.

In this type of sensor, a magnetic 1/f noise is caused by fluctuations in the magnetic orientation of regions in one or both of the layers. These fluctuations create changes in resistance at different time scales that appear as noise in the target signal and cannot be simply filtered out. A 1/f noise (also called pink noise) is a signal or fluctuation process with a frequency spectrum density (energy or power per Hz) inversely proportional to the frequency of the signal. In addition, a zero-field offset can also be created by differences in the magnetic orientation of regions in either magnetic film, which may be dependent on temperature or stress in the sensor.

Therefore, it would be desirable to have a system, device and method to effectively reduce 1/f noise and offset in TMR magnetic field sensors.

SUMMARY OF THE INVENTION

Certain embodiments of the invention provide for systems, devices and methods using a unique, bipolar chopping technique to cancel the magnetic 1/f noise and offset contribution within TMR sensors. As previously described, magnetic 1/f magnetic noise exists in TMR magnetic field sensors and can reduce the performance and sensitivity of these sensors. At low frequencies (<100 Hz) used for compassing and motion sensing applications, the 1/f magnetic noise contribution becomes dominant. This noise manifests as a low frequency meander in the zero field offset of a TMR sensor bridge, thus reducing the accuracy.

According to various embodiments of the invention, chopping technique, and associated structure, is implemented to cancel the magnetic 1/f noise contribution and offset in a TMR field sensor. The TMR field sensor comprises a first bridge circuit including a plurality of TMR elements configured to sense a magnetic field. Each TMR element comprises a first and a second ferromagnetic layers separated by a non-magnetic, insulating tunnel barrier. The TMR field sensor further comprises a second circuit configured to apply a bipolar current pulse adjacent to each of the TMR elements.

In certain embodiments, the second circuit comprises a plurality of built-in current lines placed adjacent to the second (fixed) ferromagnetic layer of each TMR element of the first bridge circuit. The current lines are serially or sequentially connected to the field source, and the bipolar current pulse is applied to all of the current lines. When the bipolar current pulse is applied, a magnetic field pulse is generated on the first (free) ferromagnetic layer. Depending on the polarity of the applied current pulse, the generated magnetic field switches the first free ferromagnetic layer into a first or second alignment.

When the bipolar current pulse is applied adjacent to each of the TMR element, the free layer orientation switches to align with the current pulse polarity. After the pulse completes, the sensor output is measured for that polarity of free layer alignment. The measured sensor output signal measured at each of the free layer polarities does not change sign, but the magnetic 1/f noise contribution and offset does. This asymmetric response allows a chopping technique where the magnetic field is applied in a first direction at a first period, then to a second direction at a second period with a repetitive rate of at least two times the desired output data rate. The sensor output signals at both periods are combined so the magnetic field sensing signal is constructively added, but the 1/f noise and offset contributions are cancelled. In one embodiment, the applied magnetic fields in said first direction and said second direction align completely with the free ferromagnetic layer. In another embodiment, the applied magnetic fields in said first direction and said second direction align in an off angle orientation with the free ferromagnetic layer for a desired (or better) switching distributions.

All aspects of this invention will directly apply to devices based on GMR as well. The inventions disclosed here also apply to any magnetic sensing technology that utilizes soft-magnetic films for sensing magnetic fields, for Example AMR, Fluxgate, Hall with a flux concentrator. For simplicity and clarity, the invention will be described in this document using TMR technology as an example.

BRIEF DESCRIPTION OF THE DRAWINGS

Reference will be made to exemplary embodiments of the present invention that are illustrated in the accompanying figures. Those figures are intended to be illustrative, rather than limiting. Although the present invention is generally described in the context of those embodiments, it is not intended by so doing to limit the scope of the present invention to the particular features of the embodiments depicted and described.

One skilled in the art will recognize that various implementations and embodiments of the invention may be practiced in accordance with the specification. All of these implementations and embodiments are intended to be included within the scope of the invention.

DETAILED DESCRIPTION OF THE PREFERRED EMBODIMENTS

In the following description, for the purpose of explanation, specific details are set forth in order to provide an understanding of the present invention. The present invention may, however, be practiced without some or all of these details. The embodiments of the present invention described below may be incorporated into a number of different electrical components, circuits, devices, and systems. Structures and devices shown in block diagram are illustrative of exemplary embodiments of the present invention and are not to be used as a pretext by which to obscure broad teachings of the present invention. Connections between components within the figures are not intended to be limited to direct connections. Rather, connections between components may be modified, re-formatted, or otherwise changed by intermediary components.

When the specification makes reference to "one embodiment" or to "an embodiment", it is intended to mean that a particular feature, structure, characteristic, or function described in connection with the embodiment being discussed is included in at least one contemplated embodiment of the present invention. Thus, the appearance of the phrase, "in one embodiment," in different places in the specification does not constitute a plurality of references to a single embodiment of the present invention.

Various embodiments of the invention are used for 1/f noise reduction and offset reduction in TMR magnetic field sensors used in various electronic devices, such as computers, laptops, media players, smart phones, wearable electronics, etc. The TMR magnetic field sensors, and the single TMR element therein, may be integrated on a single component or contain discrete components. Furthermore, embodiments of the invention are applicable to a diverse set of techniques and methods.

Figure 1:
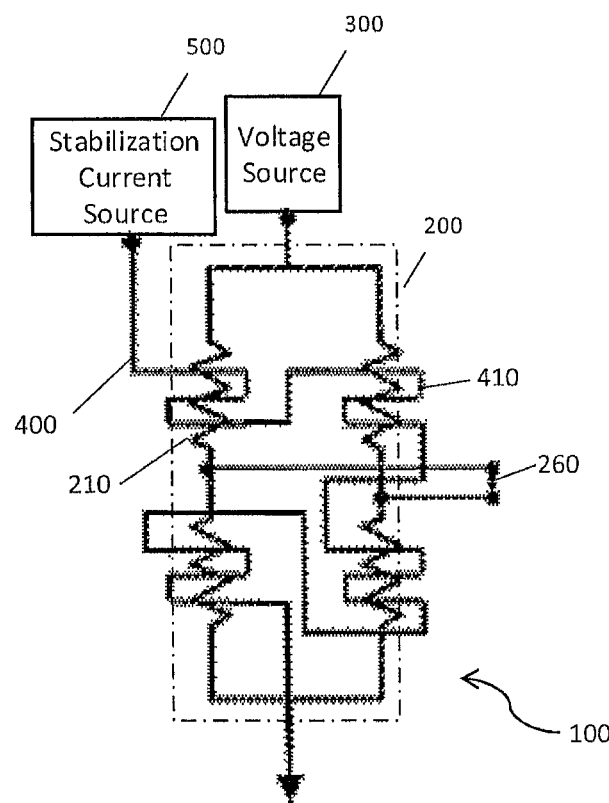
FIG. 1 is an exemplary structure overview of a TMR magnetic field sensor according to various embodiments of the invention.

FIG. 1 shows a schematic diagram of a TMR magnetic field sensor 100 according to various embodiments of the invention. The magnetic field sensor 100 comprises a first bridge circuit 200 powered by a voltage source 300, a second circuit 400 powered by an optional stabilization field source 500. In one embodiment, the field source 500 is a current source. The first bridge circuit 200 comprises a plurality of TMR elements 210. The bridge circuit 200 may be a half bridge circuit, a full bridge circuit, or any combinations thereof. In one embodiment, the bridge circuit 200 is a bridge circuit having two circuit branches with bridge output signal 260 between the two branches at some intermediate point along the branches.

Figure 2:
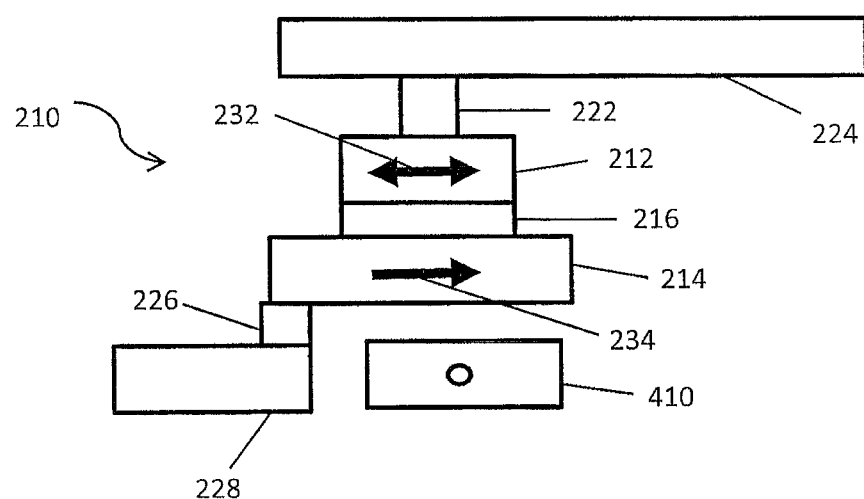
FIG. 2 is a cross-section view of a single TMR element according to various embodiments of the invention.

FIG. 2 illustrates a cross-section view of a single TMR element 210 according to various embodiments of the invention. The TMR sensor 210 is composed of a first ferromagnetic layer 212 and a second ferromagnetic layer 214 separated by a non-magnetic, insulating tunnel barrier 216. In one embodiment, the first layer 212 has a magnetization direction 232 that is free to rotate in a magnetic field. The second layer 214 has a fixed reference magnetization direction 234 that does not rotate when in a magnetic field. If the magnetization directions of the two layers are parallel to each other, the electrical resistance of the tunnel barrier 216 is low. Conversely, when the magnetization directions are antiparallel, the resistance is high. The TMR element therefore converts magnetic field into electrical signal by the changing the electrical resistance due to the changing angle of magnetic free layer relative to the fixed layer in response to the field. The ferromagnetic layers 212 and 214 may be formed from any suitable ferromagnetic material, such as Ni, Fe, Co or their alloys. The insulating tunnel barrier 216 may be composed of insulator materials such as AlOx, MgOx, ZrOx, TiOx, HfOx, or any combinations thereof.

In one embodiment, the first ferromagnetic layer 212 is connected to a first conductive line 224 by a first contact 222, and the second ferromagnetic layer 214 is connected to a second conductive line 228 by a second contact 226, which may contact from above as well as below the second ferromagnetic layer.

In one embodiment, the second circuit 400 comprises a plurality of built-in current lines 410 placed adjacent to the second ferromagnetic layer 214 of each TMR element 210. The current lines 410 are connected such that a current pulse is applied to the current line for each TMR element 210. The connection of the current lines 410 may be sequential, serial or time multiplexed according to various embodiments. In another embodiment, the current line may also be placed adjacent to the first ferromagnetic layer 212, or placed adjacent to both the first and second ferromagnetic layers of each TMR element 210. The first ferromagnetic layer 212 is patterned into a shape that has a long and a short axis. In zero magnetic field, the magnetization direction of the first ferromagnetic layer 212 lies along the long axis of the element and can be directed either of the two directions along this axis. By applying a control current signal to the current line 410, an induced magnetic field is generated in an ambient area surrounding the current line. Since the first layer 212 has a magnetization direction 232 free to rotate and switch, the magnetization direction 232 will switch to along the direction projected on its axis by the induced magnetic field. As an exemplary illustration in FIG. 2, when the current in the current line 410 has a direction pointing outward, the magnetization direction 232 points leftward, which is has a component that is negatively aligned to the reference magnetization direction 234, and will switch the free layer to the left; when the current in the current line 410 has a direction pointing inward, the magnetization direction 232 points rightward, which has a component that is positively aligned to the reference magnetization direction 234, and will switch the free layer to the right.

Figure 3:
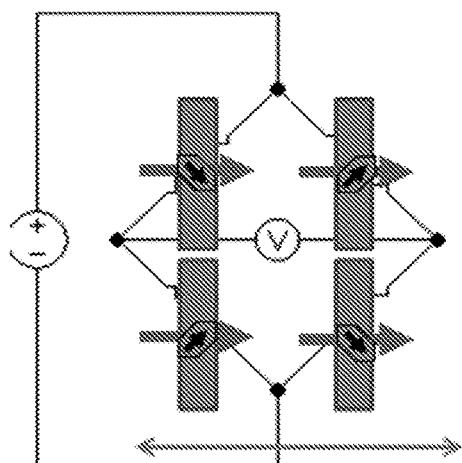
FIG. 3 is an exemplary diagram of two different chopping states according to various embodiments of the invention.
Figure 3:
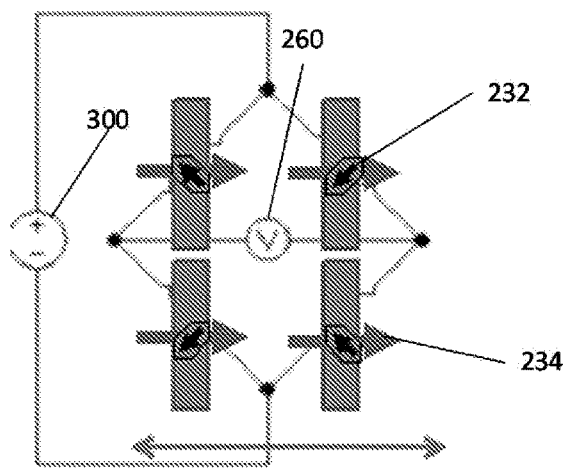

FIG. 3 illustrates an exemplary diagram of two different chopping states of a bridge circuit for X-Y axis magnetic sensing according to various embodiments of the invention. When a current pulse is applied to the current line 410, a magnetic field pulse with a magnetization direction 232 is generated on the first ferromagnetic layer. Depending on the polarity of the applied current pulse, the generated magnetic field switches the free layer direction 232 to have a component that is positively or negatively aligned to the reference magnetization direction 234 of the second ferromagnetic layer.

FIG. 3 (A) shows a generally positively aligned magnetization direction 232 in the first ferromagnetic layer 212 and FIG. 3 (B) shows a generally negatively aligned magnetization direction 232 in the first ferromagnetic layer 212. In one embodiment, the cross angle between the generated magnetization direction 232 and the reference magnetization direction 234 is 45 degree under positive alignment or 225 degrees under negative alignment. The above cross angles are described for exemplary purposes of clarity and understanding. The cross angle may be any degree between 0 and ±90 under positive alignment or any degree between 180 and 270 under negative alignment. Here the diagram is simplified so that each sense element may indicate an array of sense elements.

Figure 4:
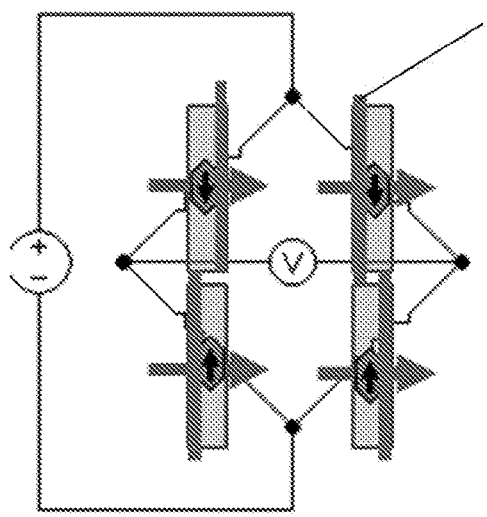
FIG. 4 is an exemplary diagram of a bridge circuit for Z-axis according to various embodiments of the invention.
Figure 4:
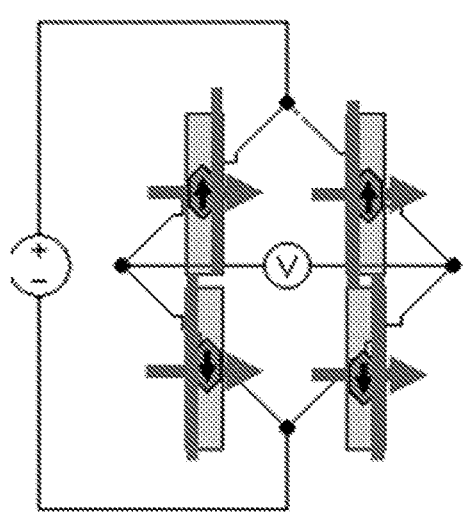

FIG. 4 illustrates an exemplary diagram of two different chopping states of a bridge circuit for Z axis magnetic sensing according to various embodiments of the invention. For Z-axis magnetic sensing, each TMR element integrates at least one flux guide 218. The flux guide 218 is a high aspect ratio vertical bar made from a high permeability material with ends terminating in close proximity to opposed edges of the magnetic sense element, in each respective bridge leg. In one embodiment, the flux guide may be displaced above and/or below the first (free) ferromagnetic layer 212. The flux guide captures magnetic flux from an applied field oriented in the Z direction, and bends the field lines to have a horizontal component near the ends of the flux guides. FIG. 4 (A) shows a +90 degree cross angle between the generated magnetization direction 232 and the reference magnetization direction 234 and FIG. 4 (B) shows a −90 degree cross angle.

Figure 5:
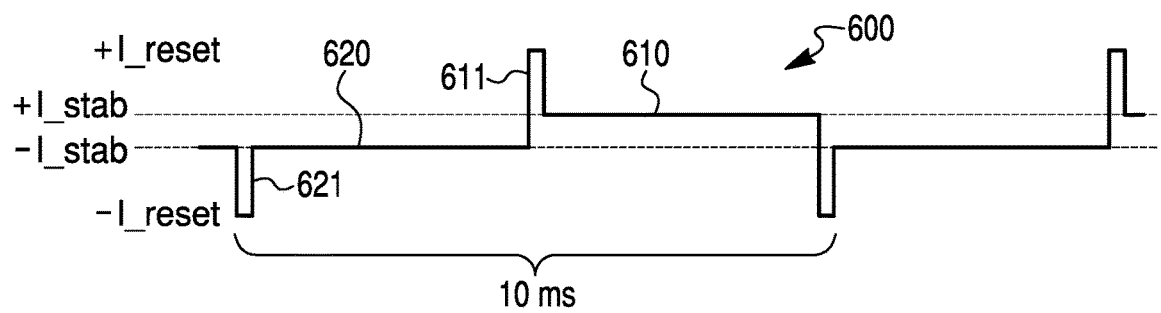
FIG. 5 is an exemplary control current signal according to various embodiments of the invention.

FIG. 5 is an exemplary control bipolar current signal 600 according to various embodiments of the invention. The reset/stabilization field source 500 is configured to generate and apply a desired control current, such as the exemplary control bipolar current signal 600 as shown in FIG. 4, to the current line 410. The bipolar current signal 600 is a cyclic signal comprising a positive portion 610 (+I_stab) and a negative portion 620 (−I_stab). In one embodiment, the bipolar current signal 600 further comprises a positive reset pulse 611 (+I_reset), which is placed at the beginning of the positive portion 610, functioned to switch the magnetization direction in a first direction. In one embodiment, the bipolar current signal 600 further comprises a negative reset pulse 621 (−I_reset), which is placed at the beginning of the negative portion 620, functioned to switch the magnetization direction in an opposite direction to the first direction.

The positive/negative reset pulses 611/621 may be very fast, being 10 to 1 M or more times smaller than the positive/negative portions, depending on output rate, power, and noise requirements. The positive/negative portions 610/620 may take any values including zero in certain circumstances. In one embodiment, the positive portion 610 is equal to the negative portion 620. In another embodiment, the positive portion 610 is different from the negative portion 620.

In one embodiment, bipolar current signal 600 is symmetric with the positive portion 610 and the negative portion 620 each occupying 50% of every cycle of the current signal 600. In one embodiment, bipolar current signal 600 is asymmetric with the positive portion 610 and the negative portion 620 occupying different percentage of every cycle of the current signal 600. In yet another embodiment, there may be a single −I reset pulse, and then a long series of +I reset pulses, where the initial measurement sampled added to each subsequent measurement following each +I reset pulse. For 1/f noise minimization, the bipolar current signal 600 is applied at a rate of at least two times the desired output data rate of the bridge output signal 260 of the magnetic field sensor 100. The 10 milliseconds cycle of the bipolar current signal 600 in FIG. 5 is for exemplary purpose and it is not intended to limit the invention to the precise form disclosed. For implementation of an offset subtraction and asymmetric cycle with an initial measurement phase maybe implemented.

Figure 6:
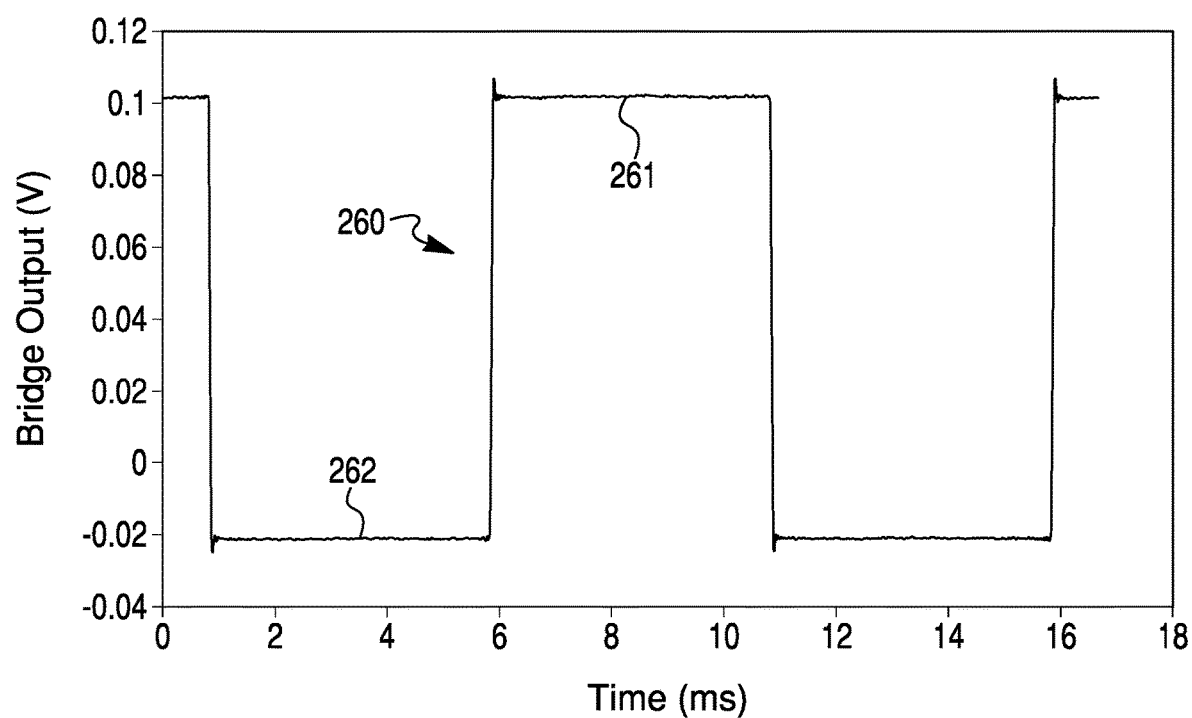
FIG. 6 is an exemplary sensor output signal according to various embodiments of the invention.

FIG. 6 shows an exemplary bridge output signal 260 in response to the applied bipolar current signal 600 in FIG. 4 according to various embodiments of the invention. The bridge output signal 260 has a high output 261 and a low output 262 in response to the positive portion 610 (+I_stab) and the negative portion 620 (−I_stab). The bridge output signal 260 responds asymmetrically to the symmetric bipolar current signal 600. In one embodiment, the high output 261 and the low output 262 are both positive. In yet another embodiment, the high output 261 is positive and the low output 262 is negative. For the applied field in this exemplary case, the positive output 261 has a higher absolute voltage value than the negative output 262. As a result, the output signal 260 has an overall average field dependent value, although the bipolar current signal 600 is symmetric and has a zero average value. In typical circuit implementation the two values would be sampled and held and added together to produce the output signal. As long as the bipolar current signal 600 is applied at a rate of at least two times the desired output data rate of the bridge output signal 260 of the magnetic field sensor 100, the implementation of bipolar current signal 600 has no interference with the normal operating output of the magnetic field sensor 100.

Figure 7:
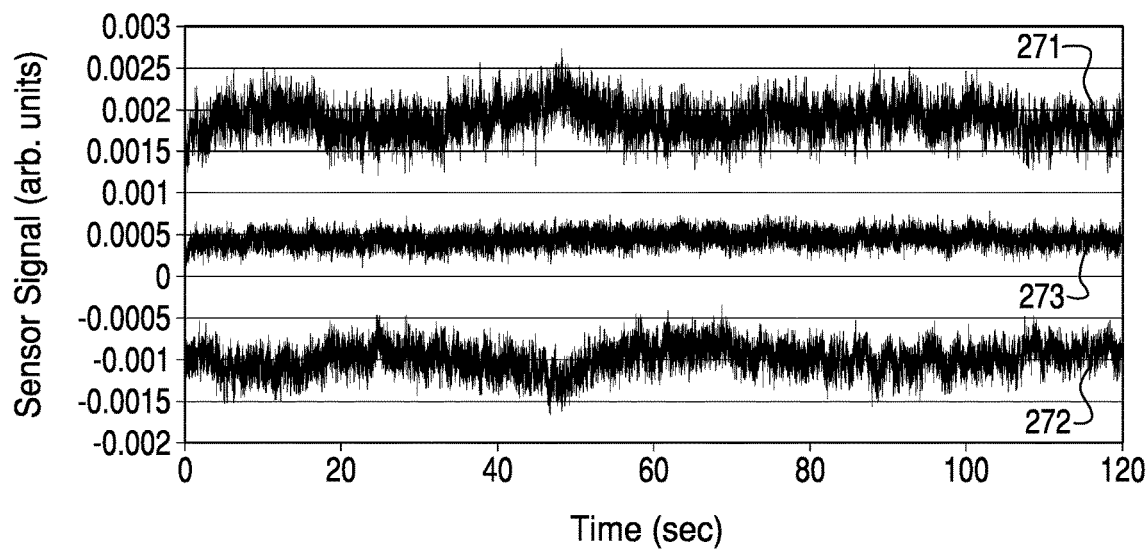
FIG. 7 is a diagram of validation measurement results according to various embodiments of the invention.

FIG. 7 shows a diagram of validation measurement results over an extended period of time according to various embodiments of the invention. The diagram includes many samples of individual signals 261 to produce the positive signal train 271 ($V_{pos}$), includes many samples of negative signals 262 to produce the negative signal train 272 ($V_{neg}$), and a total signal 273 ($V_{tot}$). In FIG. 6, the Y-axis is offset with a subtraction of a constant DC voltage to make all the results fit on single clean plot. Each point of the positive signal 271 and the negative signal 272 is taken after a delay after each reset pulse to eliminate ringing at transitions. Positive and negative signals clearly invert at low frequency. Consequently, the total signal 273 identifies a much reduced 1/f noise contribution with the positive signal 271 and the negative signal 272 cancelling out each other.

Figure 8:
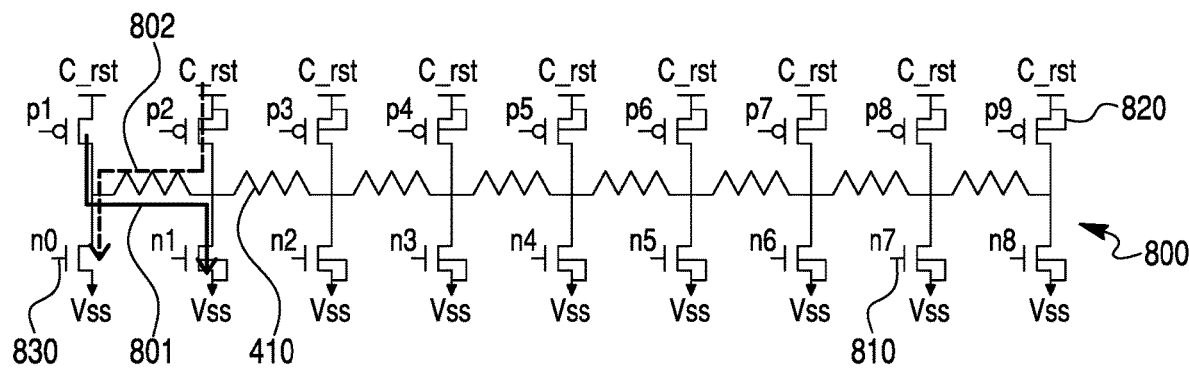
FIG. 8 is an exemplary diagram of multiple muxed (multiplexed) H bridges for sequential reset and control logic according to various embodiments of the invention.

FIG. 8 shows a multiple muxed (also called multiplexing) H bridge circuit 800 for sequential reset and control logic according to various embodiments of the invention. The muxed H bridge circuit 800 forms a plurality of single H bridge circuits for the current line 410 of each TMR element 210. The muxed H bridge circuit 800 comprises a plurality of transistors 810 to control current flow path in the current line 410. For example, p1 and n1 transistors may be closed, thus the current in current line 410 may follow a first reset path 801, then p2 and n2, etc. to allow similar reset path for the rest of the current lines sequentially. Later a second reset path 802 in the opposite direction is established by controlling the open/close of desired transistors combination, in this case p2 and n0. In one embodiment, the current path of each current line 410 is controlled separately (sequentially). In another embodiment, the current paths of all current lines 410 are controlled together for a single unified current path for all the current lines. With proper controlling logic of the mixed H bridge circuit, the magnetic field sensor would be able to execute a first measurement after a first reset pulse train, storage the first measurement values, execute a second measurement after a second reset pulse train, storage the second measurement values, summation of both measurement values to generate a total output. The mixed H bridge circuit shown in FIG. 8 can be easily expanded or contracted to accommodate various numbers of current line and transistors. The multiple mixed H bridge circuit 800 is only for an exemplary purpose. Various modifications of the mixed H bridge circuit may be possible within the scope and equivalence of the application.

Figure 9:
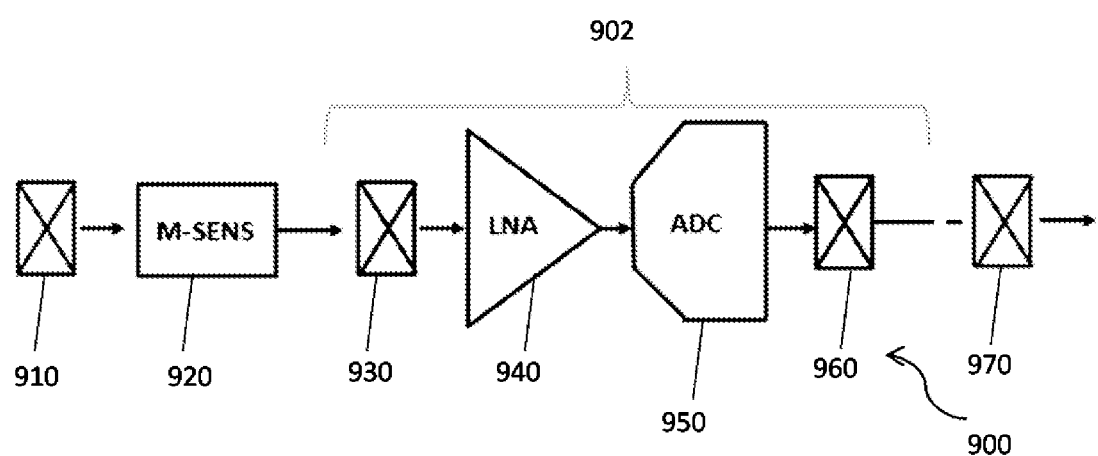
FIG. 9 is an exemplary diagram of read chain according to various embodiments of the invention.

FIG. 9 shows an exemplary read chain according to various embodiments of the invention. The read chain 900 comprises a plurality of components including magnetic bipolar reset chop 910, magnetic sensor 920, electrical chop 930, Low noise amplifier (LNA) 940, analog to digital (A/D) converter 950, electrical dechop 960, magnetic dechop 970, etc. The electrical chop 930, Low noise amplifier (LNA) 940, A/D converter 950 and electrical dechop 960 form an electrical part 902 of the read chain, which may also include components for axes Muxing, downsampling, averaging, etc. In one embodiment, the magnetic bipolar reset chop 910 operates in 1-50,000 Hz frequency range, the electrical dechop 960 operates in 40 kHz frequency, but is generally twice a magnetic chop frequency, and the magnetic dechop 970 is matched to the magnetic bipolar reset chop 910 frequency. In another embodiment, the above components may also work in other operating frequencies or order, depending on applications. The chop and de-chop pair may form a sample and hold circuit that allows signal summing in each of the state, producing sensor output 273 as in FIG. 7.

One skilled in the art will recognize that various implementations may be realized within the described architecture, all of which fall within the scope of the invention. For example, various parameters may be adjusted for the maximum elimination of the 1/f noise in TMR magnetic field sensors. Some of these parameters include reset pulse width and amplitude, bipolar current signal period, space ratio of the bipolar current signal, etc.

The foregoing description of the invention has been described for purposes of clarity and understanding. It is not intended to limit the invention to the precise form disclosed. Various modifications may be possible within the scope and equivalence of the application.

What is claimed is:

1. A magnetic sensor, comprising:
a first plurality of magnetoresistive sensor elements coupled together as a first circuit; and
a second circuit adjacent to the first circuit and configured to receive a bipolar current signal from a bipolar current source coupled to the second circuit,
wherein a portion of the second circuit is adjacent to each magnetoresistive sensor element of the first plurality of magnetoresistive sensor elements,
wherein the bipolar current signal is configured to generate magnetic field to cancel at least a portion of 1/f noise generated from at least one magnetoresistive sensor element of the first plurality of magnetoresistive sensor elements, and
wherein the bipolar current signal is asymmetric with a positive portion and a negative portion different from the positive portion occupying different percentages of the bipolar current signal.

2. The magnetic sensor of claim 1, wherein each magnetoresistive sensor element comprises:
a first ferromagnetic layer;
a second ferromagnetic layer; and
an intermediate layer between the first and second ferromagnetic layers, wherein the intermediate layer includes an insulating material.

3. The magnetic sensor of claim 2, wherein the first ferromagnetic layer of each magnetoresistive sensor element has a magnetization direction free to rotate in a magnetic field, and wherein the second ferromagnetic layer of each magnetoresistive sensor element has a fixed magnetization direction.

4. The magnetic sensor of claim 1, wherein, in response to receiving the bipolar current signal, the second circuit is configured to generate a magnetic field adjacent to each magnetoresistive sensor element of the first plurality of magnetoresistive sensor elements.

5. The magnetic sensor of claim 1, wherein the bipolar current signal is a cyclic signal including the positive portion, the negative portion, a positive reset pulse at a beginning of the positive portion, and a negative reset pulse at a beginning of the negative portion, and wherein the first circuit has an output comprising a high output and a low output in response to the positive portion and the negative portion, respectively, of the bipolar current signal.

6. The magnetic sensor of claim 1, wherein each magnetoresistive sensor element is one of a Tunneling Magnetoresistance (TMR) element, a Giant Magnetoresistance (GMR) element, or an Anisotropic Magnetoresistance (AMR) element.

7. The magnetic sensor of claim 1, wherein the first circuit is one of a bridge circuit or a half bridge circuit.

8. The magnetic sensor of claim 1, further comprising:
a flux guide positioned adjacent to at least one magnetoresistive sensor element of the first plurality of magnetoresistive sensor elements, wherein the flux guide is positioned above or below the respective magnetoresistive sensor element.

9. The magnetic sensor of claim 1, further comprising an analog to digital converter coupled to one or more of the first circuit and the second circuit.

10. The magnetic sensor of claim 1, wherein the second circuit comprises:
a plurality of current lines; and
a muxed H bridge circuit for controlling a current path in each of the plurality of current lines.

11. The magnetic sensor according to claim 1, wherein the bipolar current signal is a cyclic signal including the positive portion, the negative portion, a positive reset pulse at a beginning of the positive portion, and a negative reset pulse at a beginning of the negative portion, wherein the positive reset pulse is configured to switch a magnetization direction of a first ferromagnetic layer of each magnetoresistive sensor element in a first direction, wherein the negative reset pulse is configured to switch the magnetization direction of the first ferromagnetic layer of each magnetoresistive sensor element to a direction opposite to the first direction, and wherein the first circuit has an output comprising a high output and a low output in response to the positive portion and the negative portion, respectively, of the bipolar current signal.

12. The magnetic sensor according to claim 11, wherein the high output and the low output from the first circuit are sampled and added for the cancellation of at least a portion of the 1/f noise generated from at least one of the magnetoresistive sensor elements within the first plurality of magnetoresistive sensor elements.

13. The magnetic sensor of claim 1, further comprising:
a second plurality of magnetoresistive sensor elements coupled together as a third circuit;
a fourth circuit configured to receive a bipolar current signal, wherein a portion of the fourth circuit is adjacent to each magnetoresistive sensor element of the second plurality of magnetoresistive sensor elements;
a third plurality of magnetoresistive sensor elements coupled together as a fifth circuit; and
a sixth circuit configured to receive a bipolar current signal, wherein a portion of the sixth circuit is adjacent to each magnetoresistive sensor element of the third plurality of magnetoresistive sensor elements.

14. The magnetic sensor of claim 1, further comprising:
a second plurality of magnetoresistive sensor elements coupled together as a third circuit;
a fourth circuit configured to receive a bipolar current signal, wherein a portion of the fourth circuit is adjacent to each magnetoresistive sensor element of the second plurality of magnetoresistive sensor elements;
a third plurality of magnetoresistive sensor elements coupled together as a fifth circuit; and
a sixth circuit configured to receive a bipolar current signal, wherein a portion of the sixth circuit is adjacent to each magnetoresistive sensor element of the third plurality of magnetoresistive sensor elements,
wherein the first plurality of magnetoresistive sensor elements is configured to sense a magnetic field in a first direction, the second plurality of magnetoresistive sensor elements is configured to sense a magnetic field in a second direction orthogonal to the first direction, and the third plurality of magnetoresistive sensor elements is configured to sense a magnetic field in a third direction orthogonal to the first and second directions.

15. A magnetic sensor, comprising:
a first plurality of magnetoresistive sensor elements coupled together as a first circuit;
a second circuit adjacent to the first circuit and configured to receive a bipolar current signal from a bipolar current source coupled to the second circuit;
a second plurality of magnetoresistive sensor elements coupled together as a third circuit; and
a fourth circuit adjacent to the third circuit and configured to receive a bipolar current signal from a bipolar current source coupled to the fourth circuit,
wherein a portion of the second circuit is adjacent to each magnetoresistive sensor element of the first plurality of magnetoresistive sensor elements, wherein a portion of the fourth circuit is adjacent to each magnetoresistive sensor element of the second plurality of magnetoresistive sensor elements, and wherein the bipolar current signals are each asymmetric with a positive portion and a negative portion occupying different percentages of each cycle of the bipolar current signals.

16. The magnetic sensor of claim 15, wherein the bipolar current signals are each configured to generate a magnetic field to cancel at least a portion of 1/f noise generated from at least one magnetoresistive sensor element of the first plurality of magnetoresistive sensor elements or at least one magnetoresistive sensor element of the second plurality of magnetoresistive sensor elements.

17. The magnetic sensor of claim 16, wherein the bipolar current signals are each delivered at a rate of at least two times of an output data rate of an output signal of the first circuit or an output data rate of an output signal of the third circuit, and wherein the first circuit has an output comprising a high output and a low output in response to the positive portion and the negative portion, respectively, of the bipolar current signal, wherein the high output and the low output from the first circuit are sampled, added, and averaged for the cancellation of at least a portion of the 1/f noise generated from at least one magnetoresistive sensor element of the first plurality of magnetoresistive sensor elements or the high output and the low output from the third circuit are sampled, added, and averaged for the cancellation of at least a portion of the 1/f noise generated from at least one magnetoresistive sensor element of the second plurality of magnetoresistive sensor elements.

18. A magnetic sensor, comprising:
a first plurality of magnetoresistive sensor elements coupled together as a first circuit;
a second circuit adjacent to the first circuit and configured to receive a bipolar current signal from a bipolar current source coupled to the second circuit; and
a flux guide positioned adjacent to at least one magnetoresistive sensor element of the first plurality of magnetoresistive sensor elements, wherein the flux guide is positioned above or below the respective magnetoresistive sensor element,
wherein a portion of the second circuit is adjacent to each magnetoresistive sensor element of the first plurality of magnetoresistive sensor elements, and
wherein the bipolar current signal is configured to generate magnetic field to cancel at least a portion of 1/f noise generated from at least one magnetoresistive sensor element of the first plurality of magnetoresistive sensor elements.

19. The magnetic sensor of claim 18, further comprising:
an analog to digital converter coupled to one or both of the first circuit and the second circuit, and
wherein the first circuit is one of a bridge circuit or a half bridge circuit, and
wherein the bipolar current signal is a cyclic signal including a positive portion, a negative portion different from the positive portion, a positive reset pulse at a beginning of the positive portion, and a negative reset pulse at a beginning of the negative portion.

* * * * *